US006577542B2

(12) United States Patent
Wolrich et al.

(10) Patent No.: US 6,577,542 B2
(45) Date of Patent: *Jun. 10, 2003

(54) SCRATCHPAD MEMORY (75) Inventors: Gilbert Wolrich, Framingham, MA (US); Debra Bernstein, Sudbury, MA (US); Matthew Adiletta, Worcester, MA (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/010,334

(22) Filed: Oct. 22, 2001

(65) Prior Publication Data

US 2002/0041520 A1 Apr. 11, 2002

Related U.S. Application Data (63) Continuation of application No. 09/473,111, filed on Dec. 20, 1999, now Pat. No. 6,307,789.

(51) Int. Cl.[7] .................................................. G11C 7/00
(52) U.S. Cl. ............... 365/189.01; 365/49; 365/189.04; 365/201
(58) Field of Search .......................... 365/189.01, 49, 365/189.04, 201

(56) References Cited

U.S. PATENT DOCUMENTS

| 4,130,890 A | * | 12/1978 | Adam | 365/184 |
| 5,450,351 A | * | 9/1995 | Heddes | 365/49 |
| 5,751,987 A | * | 5/1998 | Mahant-Shetti et al. | 365/230.04 |
| 5,970,013 A | * | 10/1999 | Fischer et al. | 365/230.01 |

* cited by examiner

*Primary Examiner*—Son T. Dinh
(74) *Attorney, Agent, or Firm*—Fish & Richardson P.C.

(57) ABSTRACT

An integrated circuit includes a random access memory (RAM) storage and a controller both located on one semiconductor chip. The controller is coupled to read data from and write data to the RAM storage. The controller is programmable to perform bitwise operations on data words stored in the RAM.

19 Claims, 8 Drawing Sheets

SCRATCHPAD MEMORY

This application is a continuation of U.S. application Ser. No. 09/473,111, filed on Dec. 28, 1999 now U.S. Pat. No. 6,307,789.

BACKGROUND OF THE INVENTION

Many modern computers have a parallel structure in which several identical processors are capable of performing tasks on incoming instructions and/or data. The parallel structure can handle high instruction and/or data bandwidths if the various tasks are independent. To perform some of the tasks, the processors can access shared resources. Frequently, the shared resources include a data storage device.

SUMMARY OF THE INVENTION

According to one aspect, a integrated circuit includes a random-access memory (RAM) storage and a controller both located on the same semiconductor chip. The controller is coupled to read data from and write data to the RAM storage. The controller is programmable to perform bitwise operations on data words stored in the RAM.

DESCRIPTION

Figure 1:
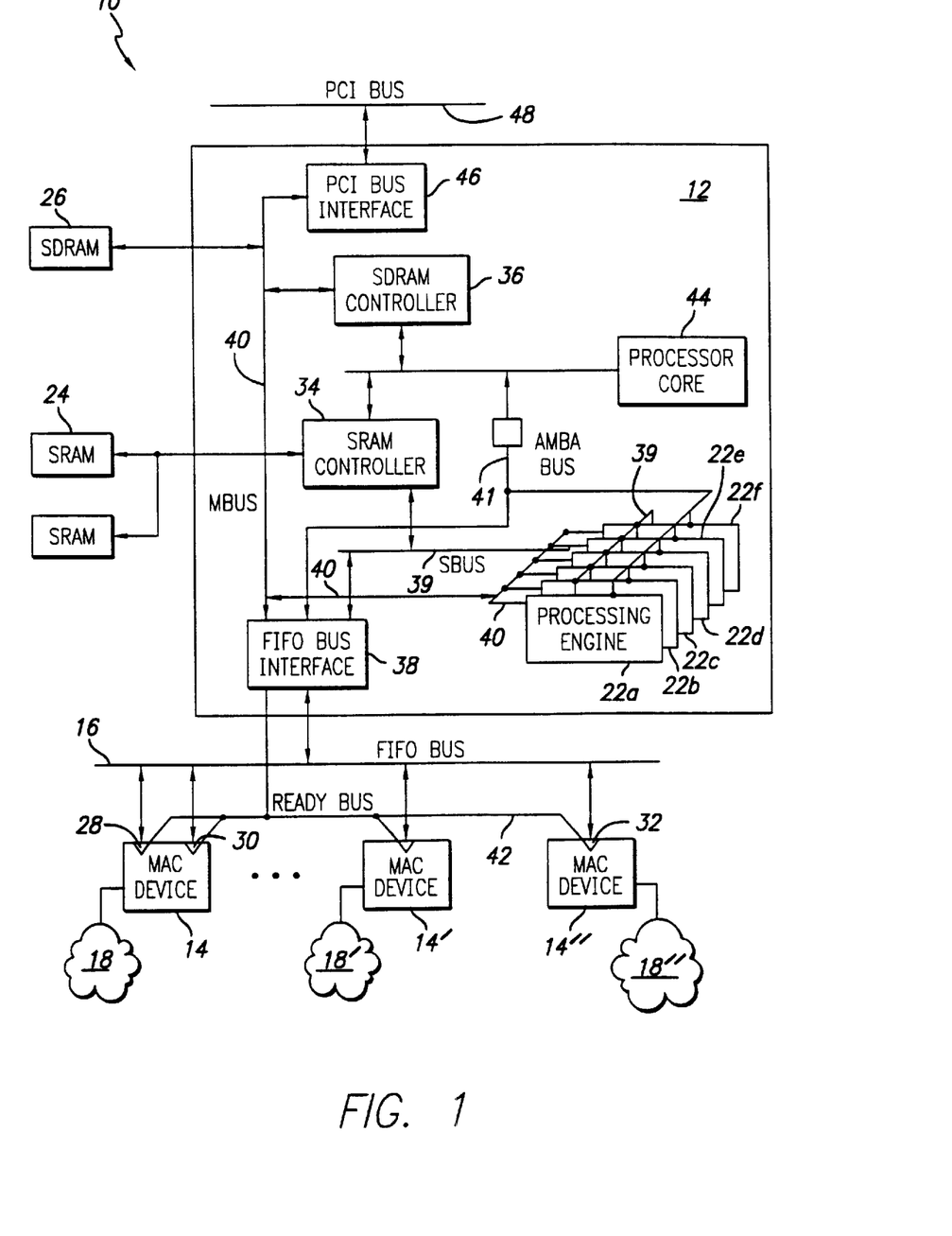
FIG. 1 is a block diagram of a router based on a multi-threaded processor.

FIG. 1 is a block diagram of a router 10 that uses a parallel processor 12, a set of media access chip (MAC) devices 14, 14', 14", and a FIFO bus 16. The router 10 performs data switching between source and destination networks 18, 18', 18" connected to the MAC devices 14, 14', 14". The MAC devices 14, 14', 14" are bridges that couple external networks 18, 18', 18" to the FIFO bus 16. The processor 12 can execute software to control data routing. By basing control on software, the processor 12 may be more easily modified to accommodate new protocols or data characteristics.

The router 10 performs data routing in two stages. First, one of the MAC devices 14, 14', 14" connected to the source network 18, 18', 18" transmits a data packet to the parallel processor 12 via the FIFO bus 16. Second, the parallel processor 12 retransmits the data packet over the FIFO bus 18 to the MAC device 14, 14', 14" connected to the destination network 18, 18', 18". The data transmissions over the FIFO bus 16 employ 64-byte data packets and proceed via an Ethernet protocol.

The parallel processor 12 has a parallel data forwarding structure that includes an array of identical processing engines 22a–22f. Each processing engine 22a–22f has an internal structure for executing a plurality of, e.g., four, independent threads.

Figure 2:
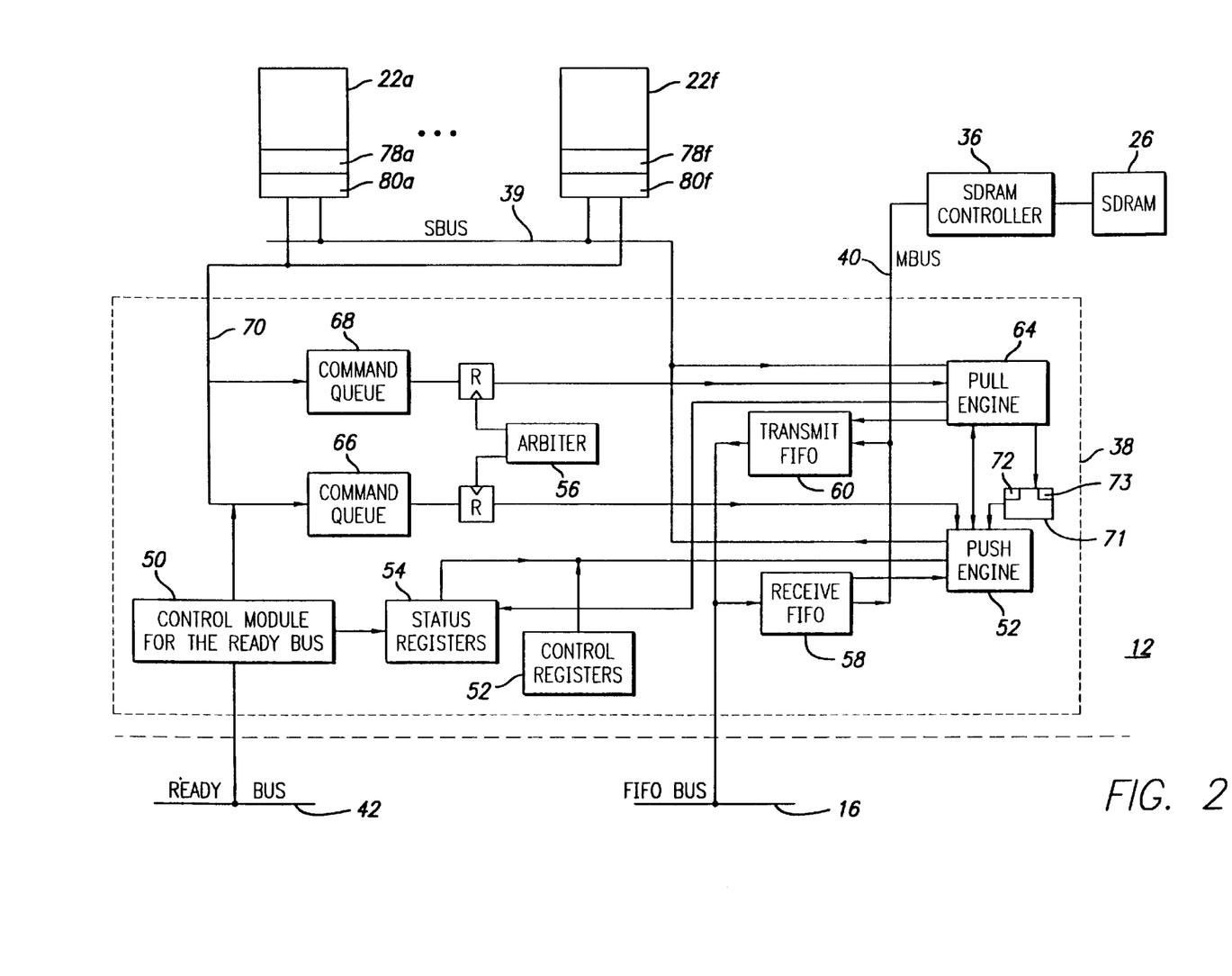
FIG. 2 is a block diagram of a FIFO bus interface of the parallel processor of FIG. 1.

Referring to FIGS. 1 and 2, the processing engines 22a–22f process data packets received from the MAC devices 14, 14', 14". To process a data packet, one of the processing engines 22a–22f looks up routing information in a synchronous random-access memory (SRAM) 24 using information from the packet header. The processing engines 22a–22f also move the data packets from a FIFO buffer 58 to a queue in a synchronous dynamic random-access memory (SDRAM) 26. The FIFO buffer 58 temporarily stores data packets received from the MAC devices 14, 14', 14". The various queues located in the SDRAM 26 are classified by destination MAC device 14, 14', 14" and retransmission priority.

The processing engines 22a–22f also process data from the queues of the SDRAM 26. This processing includes moving data packets from the queues of the SDRAM 26 to a FIFO buffer 60. The FIFO buffer 60 temporarily stores data prior to retransmission to the MAC devices 14, 14', 14" over the FIFO bus 16. Along with the data, associated control and destination information are stored in the FIFO buffer 60 for use in transmitting the data. The associated data is 16 bytes wide.

The SRAM 24 and SDRAM 26 couple to the processing engines 22a–22f through respective SRAM and SDRAM controllers 34, 36. The SRAM controller 34 has content addressable memory that supports look ups of identification information on the queues of the SDRAM 24. The look-ups use header data from received data packets. The SDRAM controller 36 coordinates data writes to and reads from the queues of the SDRAM 24 that store received data packets.

The parallel processor 12 has several internal busses 39, 40, 41. An S bus 39 couples the processing engines 22a–22f to a FIFO bus interface 38 (FBI) and to the SRAM controller 34. An M bus 40 couples the processing engines 22a–22f and the FBI 38 to the SDRAM controller 36 and the SDRAM 26. An AMBA bus 41 couples a processor core 44 to the processing engines 22a–22f and the FBI 38.

The FBI 38 controls data transfers on the FIFO bus 16 and collects status data on the readiness of the ports 28, 30, 32 of the MAC devices 14, 14', 14" to participate in data transfers over the FIFO bus 16. The ready status data is collected from the MAC devices 14, 14', 14" through a ready bus 42, which is also controlled by the FBI 38.

Referring again to FIG. 1, the processor core 44 uses software to perform a variety of functions. The functions may include data packet routing, exception handling, queue management, monitoring of data packet transfers, supporting network management protocols and/or providing local area network emulation.

The parallel processor 12 includes a PCI bus interface 46 that couples to a PCI bus 48. The PCI bus 48 can support communications between the parallel processor 12 and external processors. The other processors may control and/or reprogram the processor core 44 or other components 22a–22f, 38 of the multiprocessor 12.

Referring again to FIG. 2, the connections between the FBI 38 and the processing engines 22a–22f are shown. The FBI 38 includes a control module 50 for the ready bus 42 and a push engine 62. The control module 50 periodically collects receive-ready status data and transmit-ready status data from the MAC devices 14, 14', 14". The collected ready status data is stored in a set of status registers 54. The set includes separate registers for storing receive-ready status data and transmit-ready status data. The push engine 62 regularly sends the ready status data over the S bus 39 to scheduler threads located in the processing engines 22a–22f in response to commands from logic internal to the FBI 38.

The processing engines 22a–22f include separate receive-scheduler and transmit-scheduler threads. The receive-scheduler thread schedules the processing of data received from the FIFO bus 16. The transmit-scheduler thread schedules the processing of data to be transmitted to the FIFO bus 16.

The receive-scheduler thread assigns data forwarding and header processing tasks to other threads in the processing engines 22a–22f. These tasks include sharing operation of a push engine 62 that transports data from the receive FIFO buffer 58 in the FBI 38 to one of the storage queues in the SDRAM 26.

The transmit-scheduler thread also assigns data forwarding tasks to other threads in the processing engines 22a–22f. These tasks include sharing in operation of a pull engine 64, which moves data from the storage queues in the SDRAM 26 to the transmit FIFO buffer 60. The tasks also include directing the pull engine 62 to write transmission control and MAC device 14, 14', 14" address information to the FIFO buffer 60. Each data packet in the transmit FIFO buffer 60 has associated address and control information that control the retransmission over the FIFO bus 16.

To control data forwarding by the push and pull engines 62, 64, the execution threads of the processing engines 22a–22f send commands signals to FIFO command queues 66, 68 via a line 70. Components of the FBI 38 can also send commands to the command queues 66, 68 of push and pull engines 62, 64. For example, the ready bus controller 50 can send a command to the queue 66 that causes the push engine 62 to transfer ready status data from the status registers 54 to the processing engines 22a–22f. An arbiter 56 controls transmission of commands from the queues 66, 68 to the push and pull engines 62, 64.

The push and pull engines 62, 64 perform several types of tasks. The push and the pull engines 62, 64 are involved in bi-directional forwarding of data packets between the FIFO buffers 58, 60 and the SDRAM controller 36. The push and pull engines 62, 64 also operate a large hardware unit 71 located in the FBI 38. The push engine 62 also forwards ready status data from the set of status registers 54 to the receive- and transmit-scheduler threads located in the processing engines 22a–22f.

The hardware unit 71 performs various operations for the execution threads of the processing engines 22a–22f and includes a hash unit 72 and a scratchpad memory 73. The execution threads operate the hardware unit 71 by sending commands to the queues 66, 68. To perform the operations, the pull engine 64 retrieves input data over the S bus 39 from output transfer registers 80a–80f of the requesting processing engine 22a–22f. The pull engine 64 moves the retrieved data and associated commands to the hardware unit 71. The hardware unit 71 forwards results from the operations to the push engine 62. The push engine 62 uses command information from the command queue 66 and/or pull engine 64 to transmit the results back over the S bus 39 to input transfer registers 78a–78f of the requesting or destination processing engine 22a–22f.

Figure 3:
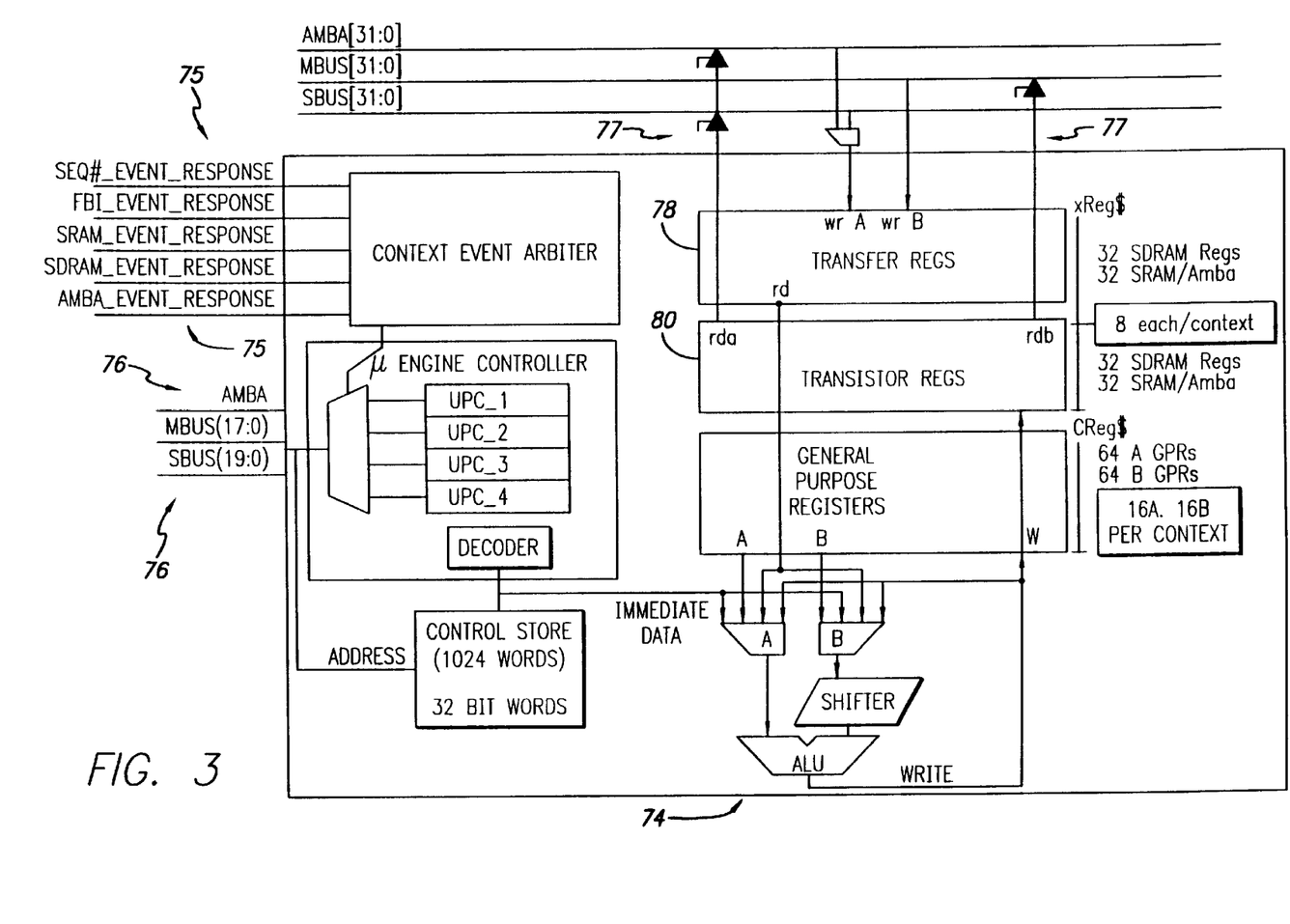
FIG. 3 is a block diagram of one of the parallel processing engines used by the multithreaded processor of FIG. 1.

Referring to FIG. 3, one embodiment 74 of the processing engines 22a–22f is shown. The processing engines 22a–22f have input/output terminals 75–77 for control signals, address signals, and data. Control signals, address signals, and data are transferred to and from the processing engines 22a–22f over three busses, i.e., the M bus 40, the S bus 39, and the AMBA bus 41. The address signals identify both a processing engine 22a–22f and an execution thread so that external commands can independently address different threads. Data is received at and transmitted from respective input and output transfer registers 78, 80. Each input and output transfer register 78, 80 is assigned to an individual execution thread. To write data to or read data from a particular execution thread, an external device accesses one of the transfer registers 78, 80 assigned to the particular thread.

Figure 4:
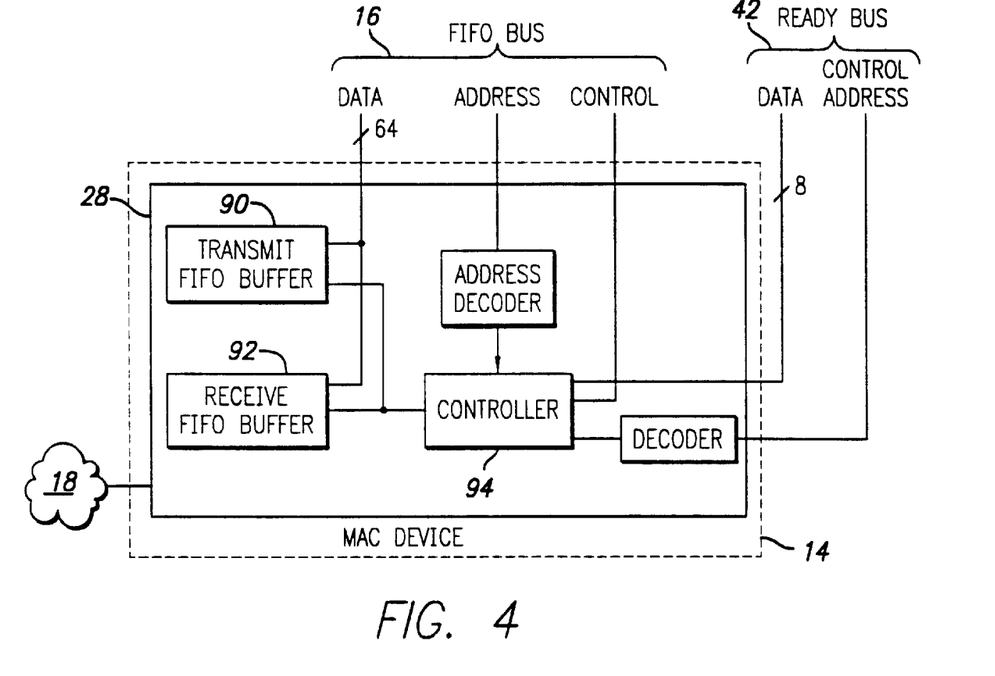
FIG. 4 is a block diagram of a MAC port coupled to the multithreaded processor of FIG. 1.

Referring to FIG. 4, the port 28 of the MAC device 14 is shown. The port 28 has transmit and receive FIFO buffers 90, 92 for storing data prior to transmission to and after reception from the FIFO bus 16, respectively. Both buffers 90, 92 have entries of fixed size that are multiples of 64 bytes, i.e., the size of data packets on the FIFO bus 16. The port 28 also includes address decoders and a controller 94. The controller 94 controls both protocol transfers over the FIFO bus 16 and responses to ready status queries from the ready bus 42. The responses to the queries indicate whether the transmit buffer 90 has a 64 byte data packet to transmit and/or whether the receive buffer 92 has space to receive a 64 byte data packet.

The various ports 28, 30, 32 of the MAC devices 14, 14', 14" may support different data transfer rates. The ports 28, 30 of the MAC devices 14, 14' support transfer rates of about ten or one hundred megabits of data per second. The port 32 of the MAC device 14" may have a transfer rate of up to about one gigabit per second.

The ready bus 42 includes control/address and data lines. The control/address lines enable selection of a transaction type and a port 28, 30, 32 of the MAC devices 14, 14', 14". The data line transfers receive- and transmit-ready status data to the FBI 38 in response to status queries from the control module 50 for the ready bus 42.

Figure 5A:
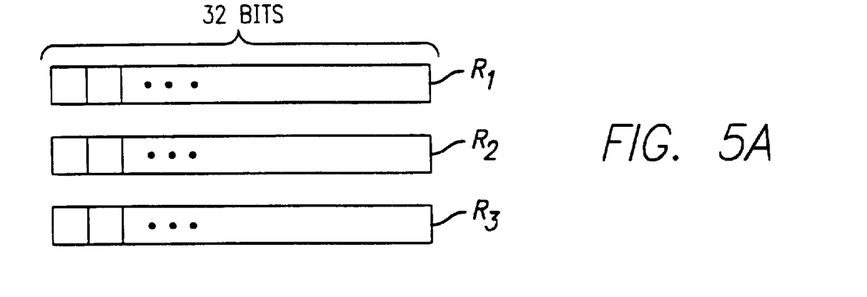
FIG. 5A shows the status registers for receive-status data.

Referring to 5A, the registers $R_1$, $R_2$, $R_3$ that store receive-ready status data are shown. The registers $R_1$ and $R_2$ store receive-ready status data for individual MAC ports 28, 30, 32. The readiness of each MAC port 28, 30, 32 to transmit a data packet to the FIFO bus 16 is indicated by the value of an associated bit or flag stored in one of the registers $R_1$, $R_2$. One logic value of the bit or flag indicates that the associated port 28, 30, 32 has a data packet ready to transmit, and the other logic value indicates the associated port 28, 30, 323 has no ready data packets. Different ports 28, 30, 32 may have data packets of different sizes, but the receive scheduler thread knows the packet size associated with each port 28, 30, 32.

The registers $R_2$ and $R_3$ have 32 bits each and thus, can accommodate receive-ready status data for up to 64 different MAC ports 28, 30, 32.

The register $R_3$ stores a cyclic counter value, which acts as a time stamp for the receive-status data stored in registers $R_1$, $R_2$. The counter value is incremented each time new receive-status data is collected. By comparing the counter value to a previously received counter value, the scheduler thread can determine whether the present receive-status data is new or stale, i.e., whether the data has already been seen.

Figure 5B:
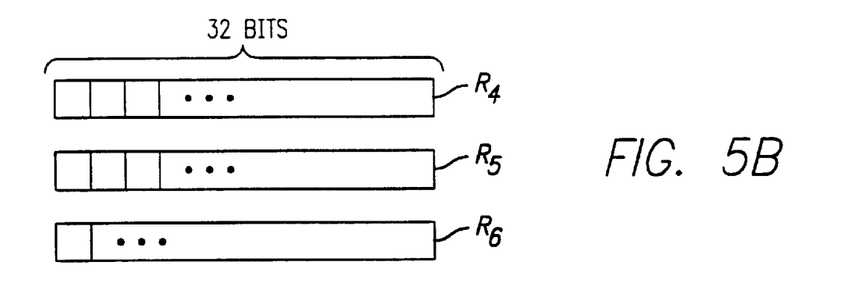
FIG. 5B shows the status registers for transmit-status data.

Referring to FIG. 5B, the registers $R_4$, $R_5$, $R_6$ that store transmit-ready status data are shown. The registers $R_4$ and $R_4$ store transmit-ready status data for individual MAC ports 28, 30, 32. Each MAC port 28, 30, 32 has an associated bit or flag in one of the registers $R_4$ and $R_4$. One logic value of the bit or flag indicates that the associated port 28, 30, 32 has enough space to receive a data packet, and the other logic value indicates the associated port 28, 30, 32 does not have enough space.

The registers $R_4$ and $R_5$ have a total of 64 bits and thus, can report transmit ready status for up to 64 MAC ports 28, 30, 32.

Figure 5C:
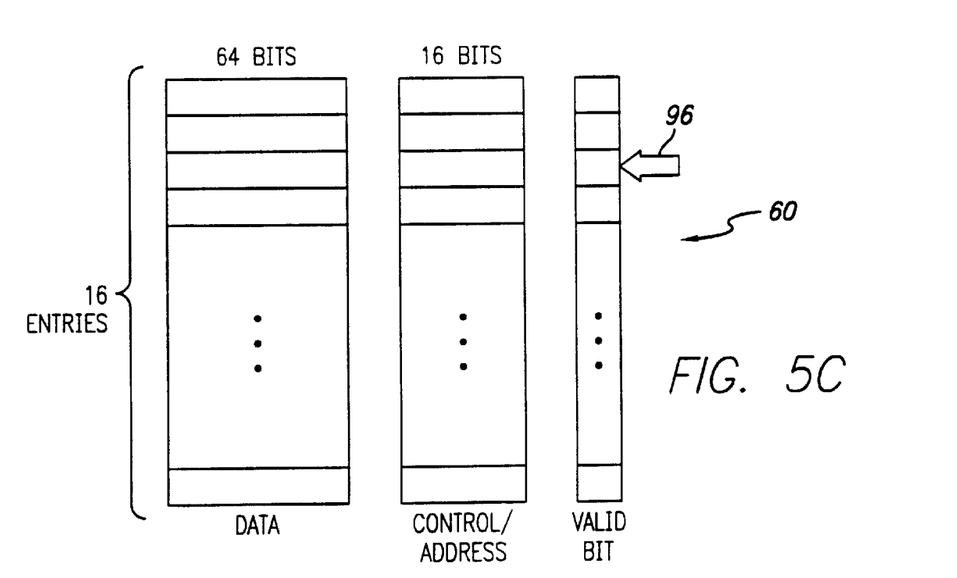
FIG. 5C shows the transmit FIFO buffer located in the FIFO bus interface of FIG. 2.

Referring to FIG. 5C, the number stored in register $R_6$ indicates the position of a remove pointer 96 in the transmit FIFO buffer 60. For an embodiment in which the transmit FIFO buffer 60 has sixteen entries, the position of the remove pointer is represented as a 4-bit number.

Since the FBI 38 transmits 64-byte data packets from the buffer 60 according to a FIFO scheme, the remove pointer 96 indicates which data packets are scheduled but not transmitted. The position of the pointer 96 can be used to determine which MAC ports 28, 30, 32 have been scheduled to receive a data packet but have not yet received a data packet. Such ports 28, 30, 32 may have status data in registers $R_4$, $R_5$ indicating an availability to receive a data packet even though the available space has already been assigned to a waiting data packet.

The transmit scheduler thread can use the position of the remove pointer 96 to interpret transmit-ready status data of the registers $R_4$, $R_5$. From the position of the remove pointer 96, the transmit scheduler thread identifies MAC ports 28, 30, 32 already scheduled to receive a data packet. The transmit scheduler thread does not schedule a new data packet for such ports, because the waiting and already scheduled data packet may take the available space therein.

In the multiprocessor 12, the collection of ready status data is asynchronous with respect to scheduling of data packet transfers. The asynchronous relationship enables both the collection of ready status data and the scheduling of data packets to have higher effective bandwidths. The asynchronous relationship also introduces some unpredictability into latencies associated with the transfer of newly collected ready status data to scheduler threads.

Figure 6:
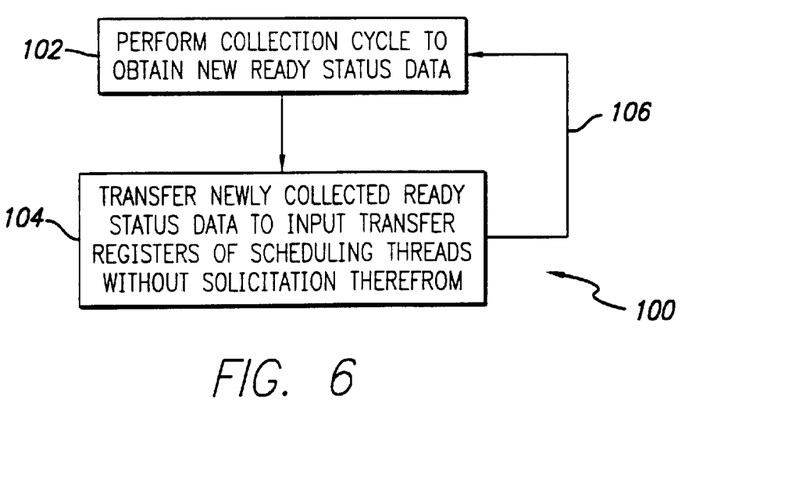
FIG. 6 is a flow chart showing a process for providing ready-status data to scheduler threads.

Referring to FIG. 6, a process 100 by which the FBI 38 provides ready status data to the scheduler threads is shown. The FBI 38 performs 102 a collection cycle in which new ready status data is obtained from the MAC devices 14, 14', 14" interactively via the ready bus 42. In response to completing the collection cycle, the FBI 38 performs an unsolicited transfer 104 of the newly collected ready status data to the input transfer registers 78a–78f assigned to the scheduler threads. In an unsolicited data transfer, the destination device for the transfer does not request the transfer. The transfer of ready status data from the FBI 38 to destination processing engines 22a–22f and scheduling threads proceeds without any request from the processing engines 22a–22f. Instead, the FBI 38 automatically performs the transfer in response to finishing a collection cycle for the ready status data. The completion of each collection cycle causes issuance of a command to the push engine 62, which transfers the ready bus data to the processing engines 22a–22f. After completing the transfer, the FBI 38 loops back 106 to collect new ready status data.

Making transfers of new ready status data unsolicited lowers latencies for delivering such data to scheduler threads. Since latencies in delivering such data can cause scheduling errors, making the transfer of ready status data unsolicited can lower numbers of occurrences of scheduling errors transmitted from respective input and output transfer registers 78, 80. Each input and output transfer register 78, 80 is assigned to an individual execution thread. To write data to or read data from a particular execution thread, an external device accesses one of the transfer registers 78, 80 assigned to the particular thread.

Referring to FIG. 4, the port 28 of the MAC device 14 is shown. The port 28 has transmit and receive FIFO buffers 90, 92 for storing data prior to transmission to and after reception from the FIFO bus 16, respectively. Both buffers 90, 92 have entries of fixed size that are multiples of 64 bytes, i.e., the size of data packets on the FIFO bus 16. The port 28 also includes address decoders and a controller 94. The controller 94 controls both protocol transfers over the FIFO bus 16 and responses to ready status queries from the ready bus 42. The responses to the queries indicate whether the transmit buffer 90 has a 64 byte data packet to transmit and/or whether the receive buffer 92 has space to receive a 64 byte data packet.

The various ports 28, 30, 32 of the MAC devices 14, 14', 14" may support different data transfer rates. The ports 28, 30 of the MAC devices 14, 14' support transfer rates of about ten or one hundred megabits of data per second. The port 32 of the MAC device 14" may have a transfer rate of up to about one gigabit per second.

The ready bus 42 includes control/address and data lines. The control/address lines enable selection of a transaction type and a port 28, 30, 32 of the MAC devices 14, 14', 14". The data line transfers receive- and transmit-ready status data to the FBI 38 in response to status queries from the control module 50 for the ready bus 42.

Referring to FIG. 5A, the registers $R_1$, $R_2$, $R_3$ that store receive-ready status data are shown. The registers $R_1$ and $R_2$ store receive receive-ready status data for individual MAC ports 28, 30, 32. The readiness of each MAC port 28, 30, 32 to transmit a data packet to the FIFO bus 16 is indicated by the value of an associated bit or flag stored in one of the registers $R_1$, $R_2$. One logic value of the bit or flag indicates that the associated port 28, 30, 32 has a data packet ready to transmit, and the other logic value indicates the associated port 28, 30, 323 has no ready data packets. Different ports 28, 30, 32 may have data packets of different sizes, but the receive scheduler thread knows the packet size associated with each port 28, 30, 32.

The registers $R_1$ and $R_2$ have 32 bits each ad thus, can accommodate receive-ready status data for up to 64 different MAC ports 28, 30, 32.

The register $R_3$ stores a cyclic counter value, which acts as a time stamp for the receive-status data stored in registers $R_1$, $R_2$. The counter value is incremented each time new receive-status data is collected. By comparing the counter value to a previously received counter value, the scheduler thread can determine whether the present receive-status data is new or stale, i.e., whether the data has already been seen.

Referring to FIG. 5B, the registers $R_4$, $R_5$, $R_6$ that store transmit-ready status data are shown. The registers $R_4$ and $R_5$ store transmit-ready status data for individual MAC ports 28, 30, 32. Each MAC port 28, 30, 32 has an associated bit or flag in one of the registers $R_4$ and $R_5$. One logic value of the bit or flag indicates that the associated port 28, 30, 32 has enough space to receive a data packet, and the other logic value indicates the associated port 28, 30, 32 does not have enough space.

The registers $R_4$ and $R_5$ have a total of 64 bits and thus, can report transmit ready status for up to 64 MAC ports 28, 30, 32.

Referring to FIG. 5C, the number stored in register $R_6$ indicates the position of a remove pointer 96 in the transmit FIFO buffer 60. For an embodiment in which the transmit FIFO buffer 60 has sixteen entries, the position of the remove pointer is represented as a 4-bit number.

Since the FBI 38 transmits 64-byte data packets from the buffer 60 according to a FIFO scheme, the remove pointer 96 indicates which data packets are scheduled but not transmitted. The position of the pointer 96 can be used to determine which MAC ports 28, 30, 32 have been scheduled to receive a data packet but have not yet received a data packet. Such ports 28, 30, 32 may have status data in registers $R_4$, $R_5$ indicating an availability to receive a data packet even though the available space has already been assigned to a waiting data packet.

The transmit scheduler thread can use the position of the remove pointer 96 to interpret transmit-ready status data of the registers $R_4$, $R_5$. From the position of the remove pointer 96, the transmit scheduler thread identifies MAC ports 28, 30, 32 already scheduled to receive a data packet. The transmit scheduler thread does not schedule a new data packet for such ports, because the waiting and already scheduled data packet may take the available space therein.

In the multiprocessor 12, the collection of ready status data is asynchronous with respect to scheduling of data packet transfers. The asynchronous relationship enables both the collection of ready status data and the scheduling of data packets to have higher effective bandwidths. The asynchronous relationship also introduces some unpredictability into latencies associated with the transfer of newly collected ready status data to scheduler threads.

Referring to FIG. 6, a process 100 by which the FBI 38 provides ready status data to the scheduler threads is shown. The FBI 38 performs 102 a collection cycle in which new ready status data is obtained from the MAC devices 14, 14', 14" interactively via the ready bus 42. In response to completing the collection cycle, the FBI 38 performs an unsolicited transfer 104 of the newly collected ready status data to the input transfer registers 78a–78f assigned to the scheduler threads. In an unsolicited data transfer, the destination device for the transfer does not request the transfer. The transfer of ready status data from the FBI 38 to destination processing engines 22a–22f and scheduling threads proceeds without any request from the processing engines 22a–22f. Instead, the FBI 38 automatically performs the transfer in response to finishing a collection cycle for the ready status data. The completion of each collection cycle causes issuance of a command to the push engine 62, which transfers the ready bus data to the processing engines 22a–22f. After completing the transfer, the FBI 38 loops back 106 to collect new ready status data.

Making transfers of new ready status data unsolicited lowers latencies for delivering such data to scheduler threads. Since latencies in delivering such data can cause scheduling errors, making the transfer of ready status data unsolicited can lower numbers of occurrences of scheduling errors.

Figure 7:
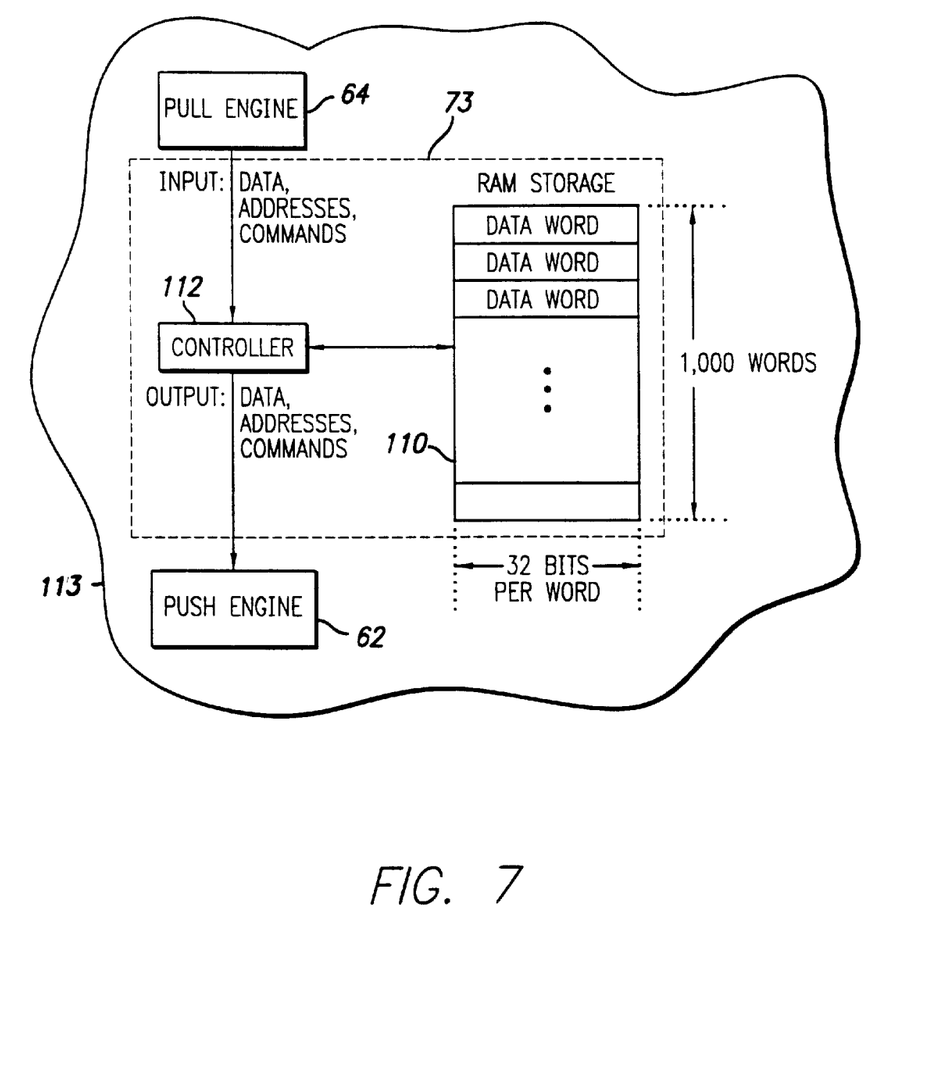
FIG. 7 is a block diagram of a shared scratchpad memory.

Referring to FIG. 7, the scratchpad memory 73 is shown. The scratchpad memory 73 includes RAM storage 110 and a controller 112 to operate the RAM storage 110. The RAM storage 110 can store, e.g., about 1,024 words having lengths of 32 bits each. The controller 112 has decode and control hardware that provide read and write operations for accessing the RAM storage 110. The controller 112 has additional hardware that provides support for performing bitwise operations on individual data words stored in the RAM storage 110.

The scratchpad memory 73 interfaces with other devices through the pull and push engines 64, 62. The pull engine 64 provides input commands, data and associated storage addresses to the controller 112. The data may include data words to write to the scratchpad memory 73 and mask words that define bit locations affected by the bitwise operations in the scratchpad memory 73. The push engine 62 receives output commands, data, and associated destination addresses from the controller 112. In some embodiments, the push engine 62 also sends read commands to the controller 112, because reads only require command and address signals, i.e., no data is inputted to the scratchpad memory 73.

The pull and push engines 64, 62 enable any of the processing engines 22a–22f to use the scratchpad memory 73. The scratchpad memory 73 is a shared on-chip resource. The processing engines 22a–22f and FBI 38, including the scratchpad memory 73, are parts of one integrated circuit, which is located on a semiconductor chip 113. The processing engines 22a–22f share the on-chip scratchpad memory 73 to store data and perform bitwise operations on data. Using a shared resource to perform rare operations and provide storage can reduce overall hardware costs associated with the large array of processing engines 22a–22f.

The bitwise operations performed by the scratchpad memory 73 include set, clear, "test and set", "test and clear", and increment operations. Each bitwise operation uses a 32 bit mask received from the pull engine 64. The mask defines locations at which bitwise manipulations will be performed, e.g., by locations of bits with the value 1 in the mask.

Figure 8A:
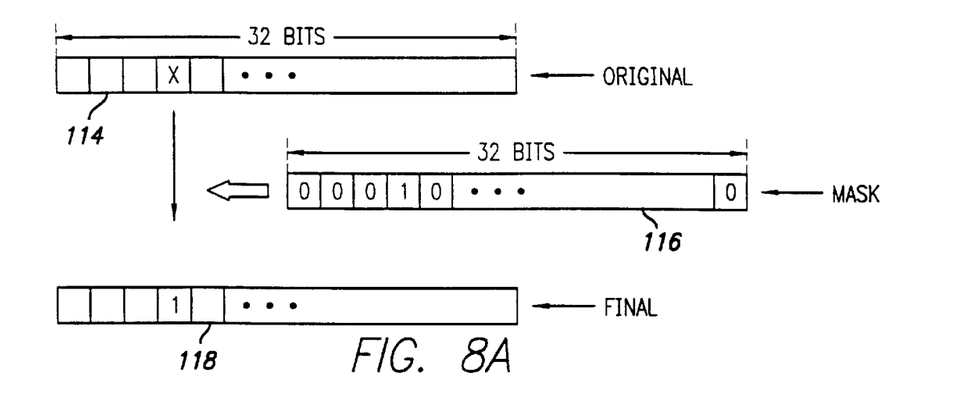
FIG. 8A shows a bitwise set operation on a data word.
Figure 8B:
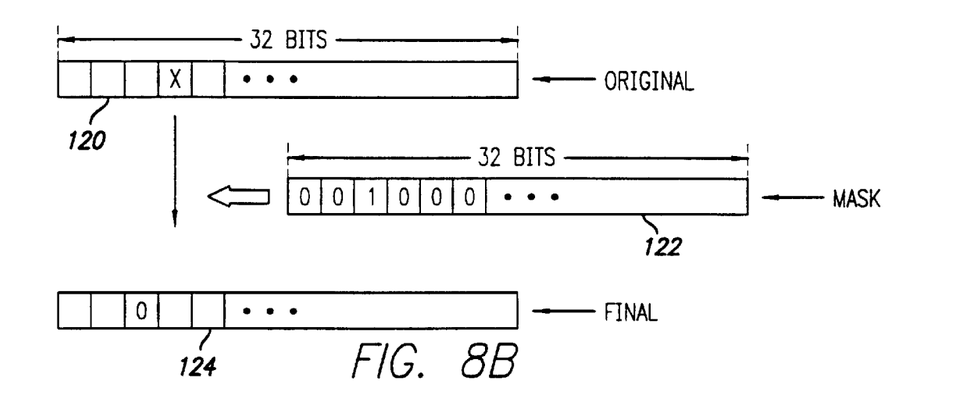
FIG. 8B shows a bitwise clear operation on a data word.
Figure 8C:
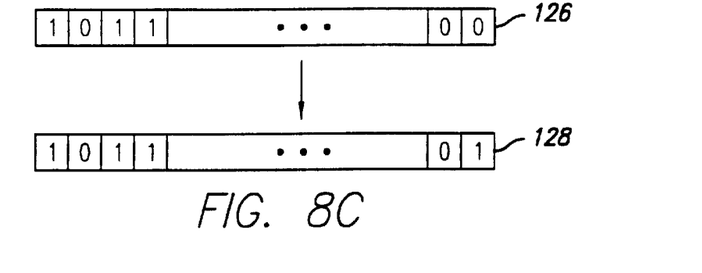
FIG. 8C shows a bitwise increment operation on a data word.

FIGS. 8A–8C illustrate the bitwise set, clear, and increment operations performed by the scratchpad memory 73. The bitwise operations act on single words from the RAM storage 110.

Referring to FIG. 8A, the action of the bitwise "set" operation on a data word 114 is shown. The "set" operation sets selected bits of the data word 114 to the value 1. The bit selection is defined by a mask word 116 having the same size as the data word 114. Each location of the data word for which the same bit location in the mask word has the value 1 is selected for the set operation. For the mask word 116, the set operation produces the final word 118 from the data word 114.

Referring to FIG. 83, the action of the bitwise "clear" operation on a data word 120 is shown. The "clear" operation fixes selected bits of the data word 120 to the value 0. Again, bit selection is defined by a mask word 122 having the same size as the data word 120. Each location of the data word for which the same location in the mask word has the value 1 is selected for the clear operation. For the mask word 122, the clear operation produces the final word 124 from the data word 120.

Referring to FIG. 8C, the action of the bitwise increment operation on a data word 126 is shown. The increment operation adds 1 to the data word 126 to produce a final data word 128. The increment operation can be used to implement a cyclic counter in the scratchpad memory 73.

Figure 9:
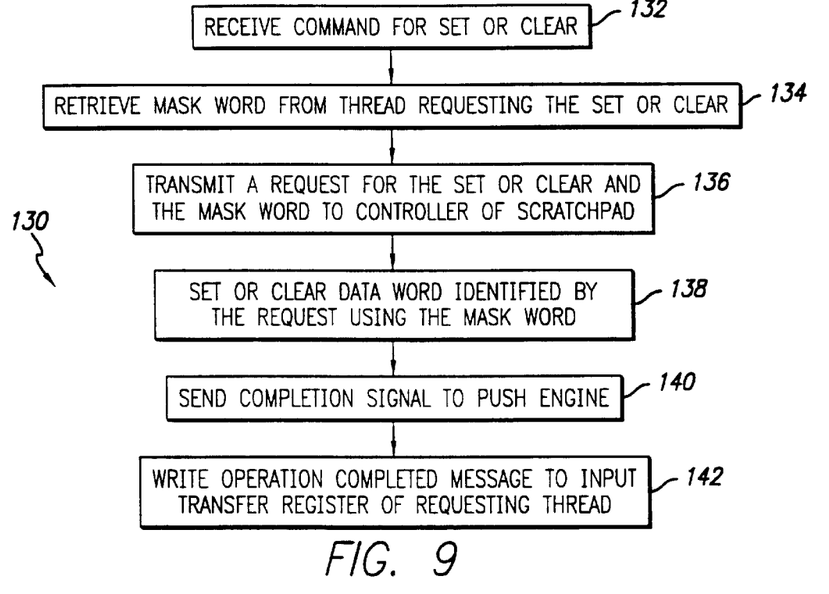
FIG. 9 is a flow chart showing a process for performing bitwise set and clear operations.

Referring to FIG. 9, a process 130 by which the FBI 38 performs the set or clear operations is shown. The operation starts when the pull engine 64 receives 132 a command to perform a set or clear operation from one of the execution threads. The command identifies an address in the scratchpad memory 73 of a data word to be set or cleared. In response to the command, the pull engine 64 retrieves 134 a mask word from the output transfer register 80a–80f associated with the thread requesting the operation. The pull engine 64 transmits 136 a request for the set or clear, as appropriate, and the retrieved mask word to the controller 112 of the scratchpad memory 73. The controller 112 sets or clears 138 a data word of the RAM storage 110. The request identifies the address of the data word to be set or cleared. The bits being set or cleared are defined by the mask word transmitted by the pull engine 64 as already described. After completing the set or clear, the controller 112 sends 140 a completion signal to the push engine 62. The push engine 62 writes 142 an operation completed message to an input transfer register 80*a* of the execution thread that requested the operation.

Figure 10:
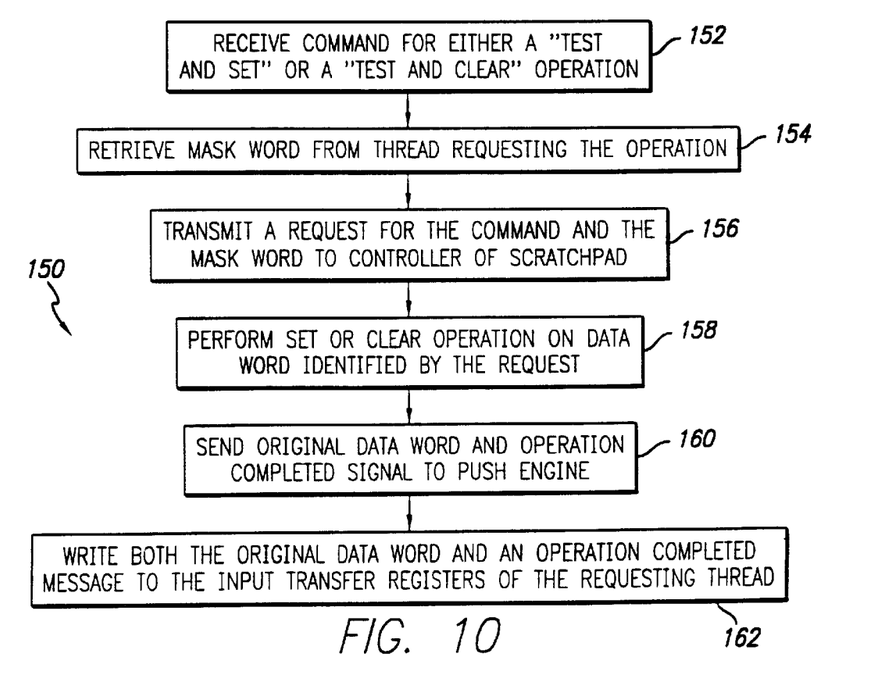
FIG. 10 is a flow chart showing a process for performing a bitwise "test and set" and "test and clear" operations.

Referring to FIG. 10, a process 150 by which FBI performs a "test and set" or a "test and clear" operation is shown. The pull engine 64 receives 152 a command to perform a "test and set" or a "test and clear" operation from one of the execution threads. The command identifies the address of the data word of the scratchpad memory 73 upon which the operation will act. The pull engine 64 retrieves 154 a mask word from an output transfer register 80*a*–80*f* assigned to the thread requesting the operation. The pull engine 64 transmits 156 a request for the command and the mask word to the controller 112 of the scratchpad memory 73.

The controller 112 performs 156 a set or clear operation on a data word stored in the RAM storage 110. If the command is for a "test and set", the set operation is performed. If the command is for a "test and clear", the clear operation is performed. In either case, the form of the operation performed is defined by the transmitted mask word as already described.

After completing the appropriate operation, the controller 112 sends 158 both the original data word and operation completed signal to the push engine 62. The push engine 62 writes 160 the original data word and an operation completed message to input transfer registers 80*a* of the execution thread that requested the operation. Thus, the requesting thread can determine from the data word received whether the set or clear operation has resulted in a change to the data word.

While various embodiments have been described in the detailed description, the description is intended to illustrate and not to limit the scope of the invention, which is defined by the appended claims. Other aspects, advantages, and modifications are within the scope of the claims.

What is claimed is:

1. An integrated circuit, comprising: a random access memory (RAM) storage located on a semiconductor chip; and
    a controller located on the semiconductor chip and coupled to read data from and write data to the RAM storage, the controller being programmable to perform bitwise operations on data words stored in the RAM according to a mask word.

2. The integrated circuit of claim 1 wherein the controller is configured to operate on bits of the data word that correspond to bits of the mask word having a preselected value.

3. The integrated circuit of claim 2, wherein the controller is configured to perform one of bitwise set and a bitwise clear.

4. The integrated circuit of claim 1 wherein the controller is configured to perform one of bitwise "test and set" and bitwise "test and clear".

5. The integrated circuit of claim 1 wherein the controller is configured to perform an increment operation on the data words.

6. The integrated circuit of claim 1 further comprising:
    a plurality of processing engines located on the integrated chip and coupled to program the controller.

7. The integrated circuit of claim 6, wherein the controller is coupled to receive data from and write data to the processing engines.

8. The integrated circuit of claim 7, wherein the controller is coupled to receive a mask word from one of the processing engines in response to the one of the processing engines programming the controller.

9. A method of operating on data, comprising:
    receiving a command for bitwise operation at a pull engine;
    sending a request for the command from the pull engine to a controller; and
    performing a bitwise operation on a data word stored in a RAM storage in response to the request.

10. The method of claim 9 wherein the performing operates on bits of the data word that correspond to bits of a mask word with a preselected value.

11. The method of claim 9 wherein the performing includes doing one of a bitwise set and a bitwise clear on the data word.

12. The method of claim 9, further comprising:
    sending a copy of the data word to the engine.

13. The method of claim 9 wherein the command selects the data word from among a plurality of such data words stored in the RAM storage.

14. A network processor, comprising:
    a parallel set of engines for processing data packets;
    a bus interface to transmit and receive the data packets; and
    a shared scratchpad memory coupled to receive commands from the engines, the scratchpad memory providing RAM storage for the engines, and capable of performing bitwise operations on data words stored therein in response to commands received from the engines.

15. The network processor of claim 14 wherein the engines and the bus interface are located in one integrated circuit.

16. The network processor of claim 14, further comprising:
    a RAM coupled to the engines and to the bus interface, the engines capable of writing received data packets from the bus interface to the RAM and of sending data packets from the RAM to the bus interface.

17. A computer program product for processing data packets that resides on a machine readable medium and comprises instructions for causing a processing engine to:
    send a command to a pull engine, the command requesting a bitwise operation be performed on a data word stored in a scratchpad memory; and
    write to an output transfer register readable by the engine to define the location of one or more bits of the data word on which the operation is performed.

18. The computer program product of claim 17 wherein the command requests one of a bitwise set and a bitwise clear on the data word.

19. The computer program product of claim 17 wherein the instructions further cause the processing engine to:
    read a copy of the data word sent from the scratchpad to the engine.

* * * * *

UNITED STATES PATENT AND TRADEMARK OFFICE
CERTIFICATE OF CORRECTION

PATENT NO.    : 6,577,542 B2
DATED         : June 10, 2003
INVENTOR(S)   : Gilbert Wolrich, Debra Bernstein and Matthew J. Adiletta It is certified that error appears in the above-identified patent and that said Letters Patent is hereby corrected as shown below:

<u>Column 1,</u>
Lines 3-5, delete existing paragraph and add the following new paragraph:
-- This application is a continuation of U.S. Serial Number 09/473,111, filed December 28, 1999, issued as U.S. Patent 6,307,789. --

Signed and Sealed this

Ninth Day of September, 2003

JAMES E. ROGAN
*Director of the United States Patent and Trademark Office*